United States Patent
Jang et al.

(10) Patent No.: US 8,493,269 B2
(45) Date of Patent: Jul. 23, 2013

(54) MAGNETODIELECTRIC SUBSTRATE AND ANTENNA APPARATUS USING THE SAME

(75) Inventors: Soo-Yong Jang, Daegu (KR); Austin Kim, Gyeonggi-do (KR); Jae-Ho Lee, Gyeonggi-do (KR); Young-Soon Lee, Gyeongbuk (KR); Ui-Jung Kim, Gyeongbuk (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 407 days.

(21) Appl. No.: 12/878,268

(22) Filed: Sep. 9, 2010

(65) Prior Publication Data
US 2011/0068991 A1     Mar. 24, 2011

(30) Foreign Application Priority Data
Sep. 23, 2009    (KR) ........................ 10-2009-0089954

(51) Int. Cl.
*H01Q 1/38*        (2006.01)
(52) U.S. Cl.
USPC ..................... 343/700 MS; 343/702; 343/787

(58) Field of Classification Search
USPC .................................. 343/702, 700 MS, 787
See application file for complete search history.

(56) References Cited

U.S. PATENT DOCUMENTS
4,477,813 A * 10/1984 Weiss ..................... 343/700 MS

FOREIGN PATENT DOCUMENTS
CN        101510630 A * 8/2009

* cited by examiner

*Primary Examiner* — Dieu H Duong
(74) *Attorney, Agent, or Firm* — Cha & Reiter, LLC

(57) ABSTRACT

A magnetodielectric substrate includes a first dielectric layer, a second dielectric layer, conductive patterns, and a plurality of air vias. The first dielectric layer has a predetermined height, and the second dielectric layer is stacked on the first dielectric layer. Conductive patterns are coated on an upper surface and a lower surface of one of the first and second dielectric layers. A plurality of air vias is formed with a predetermined diameter and a predetermined interval such that they pass through up to the conductive patterns of the upper and lower surfaces from the dielectric layer on which the conductive patterns are coated.

15 Claims, 9 Drawing Sheets

MAGNETODIELECTRIC SUBSTRATE AND ANTENNA APPARATUS USING THE SAME

CLAIM OF PRIORITY

This application claims the benefit of priority of the earlier filing date, under 35 U.S.C. §119(a) from Korean patent application Serial No. 10-2009-0089954 filed in the Korean Intellectual Property Office on Sep. 23, 2009, the entire disclosure of which is hereby incorporated by reference in its entirety.

BACKGROUND OF THE INVENTION

1. Field of the Invention

The present invention relates to a magnetodielectric substrate and an antenna apparatus using the same. More particularly, the present invention relates to a magnetodielectric substrate and an antenna apparatus using the same, for realizing a magnetodielectric substrate that is relatively easily designed and formed, and for applying the antenna apparatus on the magnetodielectric substrate.

2. Description of the Related Art

Generally, electronic apparatuses for transmitting and/or receiving a signal wirelessly have an antenna radiator. Such electronic apparatuses advance in design over time so as to gradually extend their functionality while maintaining their existing size or reducing their size. In the case of an antenna radiator, its radiation efficiency improves in proportion to its size but its size is limited so that the antenna radiator may be applied to an apparatus that is being gradually miniaturized.

Of apparatuses having the above-described antenna apparatus, a mobile terminal is exemplarily described herein. Terminal manufacturers make great efforts to improve a radiation performance of the antenna radiator in order to provide a stable and a relevant service.

Furthermore, nowadays there is a multi-band antenna radiator realized such that various bands operate in one antenna radiator. For this purpose, various patterns that can operate in a relevant band are being applied. Consequently, miniaturization of an antenna radiator is indispensably limited with only the structure itself of the antenna radiator.

In addition, when the antenna radiator has a higher radiation gain, the antenna radiator tends to increase the life of a battery pack, which is a power-supplying means of the mobile terminal, and helps to achieve stable signal transmission/reception. However, when the radiation gain of the terminal increases, a Specific Absorption Ratio (SAR) that influences a human body also correspondingly increases, wherein the increased SAR has an adverse influence on a user of the mobile terminal, particularly as the user typically presses the mobile terminal against his/her head during operation. Therefore, terminals generally brought to the marketplace are designed to have a radiation gain of about −1 dB to −2 dB in order to meet an appropriate SAR. For this reason, an improvement in performance of the terminal is limited.

More particularly, a contact portion of the above-described antenna radiator comprises a portion where hot spots are concentrated and the emission of electromagnetic waves is large. When the radiation gain is limited to a predetermined level, an antenna's radiation performance deteriorates.

In order to solve the above-described problem, an effort for changing a portion of a dielectric substrate to which the antenna radiator is applied, into a magnetodielectric is actively being made. As one of such methods, a Metallic Wire Substrate (MWS) structure in which a magnetodielectric operates in a wide range of frequencies with a relatively simple structure can be designed has been suggested. This MWS structure has a shape in which vertical conductors are arranged on a dielectric substrate with a very narrow interval there between, and the MWS structure has a ground plane among two dielectric substrates (a first dielectric layer and a second dielectric layer). In this structure (periodic structure), the vertical conductor portion may be considered to be a conductor via of a general dielectric substrate (Printed Circuit Board (PCB)). A magnetodielectric structure that operates in a wide range of frequencies may be designed by controlling a diameter of a via, an interval between vias, and a height of a via.

However, when the above-described MWS structure is used, although a magnetodielectric that operates in a wide range of frequencies may be designed, when actually manufacturing the MWS structure, a conductor via having a very narrow interval and diameter has to be realized. In addition, since the MWS structure should be a structure where conductive patterns exist on only one side of the dielectric substrate, and the inside of the conductor via should be completely filled, it is difficult to use a general PCB manufacturing process.

SUMMARY OF THE INVENTION

An exemplary aspect of the present invention is to address at least the above-mentioned problems and/or disadvantages and to provide at least the advantages described below. Accordingly, an exemplary aspect of the present invention is to provide a magnetodielectric substrate and an antenna apparatus using the same, that are relatively easily manufactured than known heretofore so that the magnetodielectric substrate may be during a dielectric substrate process.

Another exemplary aspect of the present invention is to provide a magnetodielectric substrate and an antenna apparatus using the same that are manufactured at remarkably lower costs than known heretofore.

Still another exemplary aspect of the present invention is to provide an antenna apparatus having the same or better radiation characteristic with a relatively reduced volume by providing a magnetodielectric substrate that aims to increase a refractive index and an effective permeability.

Yet another exemplary aspect of the present invention is to provide a magnetodielectric substrate and an antenna apparatus using the same that are realized to remarkably reduce an SAR influence on a human body by applying a magnetodielectric structure in proximity to a feeding portion and a ground portion of an antenna radiator.

Still another exemplary aspect of the present invention is to provide a mobile terminal having an excellent radiation characteristic with a slimmer profile than the conventional terminal by applying a magnetodielectric substrate and an antenna apparatus as shown and described herein.

In accordance with another exemplary aspect of the present invention, a magnetodielectric substrate is provided. The magnetodielectric substrate includes a first dielectric layer having a predetermined height, a second dielectric layer stacked on the first dielectric layer, conductive patterns coated on an upper surface and a lower surface of one of the first and second dielectric layers, and a plurality of air vias formed with a predetermined diameter and at a predetermined interval such that they pass through up to the conductive patterns of the upper and lower surfaces from the dielectric layer on which the conductive patterns are coated.

In accordance with another exemplary aspect of the present invention, an antenna apparatus is provided that is applied on the above-described magnetodielectric substrate. In this particular case, since an electrical characteristic is controlled by changing a size of a diameter of an air via formed on the dielectric layer, an interval between air vias, and/or a thickness of the dielectric layer, a volume of the applied antenna apparatus may be minimized.

In accordance with still another exemplary aspect of the present invention, a mobile terminal including the above-described magnetodielectric substrate and the antenna apparatus applied to the substrate is provided.

Other exemplary aspects, advantages and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other exemplary aspects, features and advantages of certain exemplary embodiments of the present invention will become more apparent to a person of ordinary skill in the art from the following description taken in conjunction with the accompanying drawings in which.

Throughout the drawings, like reference numerals will be understood to refer to like parts, components and structures.

DETAILED DESCRIPTION

The following detailed description with reference to the accompanying drawings is provided to assist a person of ordinary skill in the art in a comprehensive understanding of exemplary embodiments of the invention as defined by the claims and their equivalents. The description includes various specific details to assist in that understanding but these are to be regarded as being merely exemplary. Accordingly, those of ordinary skill in the art will recognize that various changes and modifications of the examples described herein can be made without departing from the spirit of the invention and the scope of the appended claims. Also, descriptions of well-known functions and constructions may be omitted for clarity and conciseness when their inclusion might obscure appreciation of the subject matter of the present invention by a person of ordinary skill in the art.

The terms and words used in the following description and claims are not limited to the bibliographical meanings, but, are merely used by the inventor to enable a clear and consistent understanding of the invention by a person of ordinary skill in the art. Accordingly, it should be apparent to those skilled in the art that the following description of exemplary embodiments of the present invention are provided for illustration purposes only and not for the purpose of limiting the claimed invention.

It is to be understood that the singular forms "a," "an," and "the" include plural references unless the context clearly dictates otherwise. Thus, for example, a reference to "a component surface" includes reference to one or more of such surfaces.

By the term "substantially" it is typically meant that the recited characteristic, parameter, or value need not be achieved exactly, but that deviations or variations, including but in no way limited to, for example, tolerances, measurement error, measurement accuracy limitations and other factors known to persons of ordinary skill in the art, may occur in amounts that do not preclude the effect the characteristic was intended to provide.

In describing a magnetodielectric structure according to an exemplary embodiment of the present invention, though the magnetodielectric structure is applied to a general dielectric substrate i.e., Flame Retardant 4 (FR4) and an antenna apparatus for use in a mobile terminal to which this substrate is applied is described, the structure is not limited thereto. For example, the magnetodielectric structure is applicable to various substrates applied to various electronic apparatuses.

Figure 1:
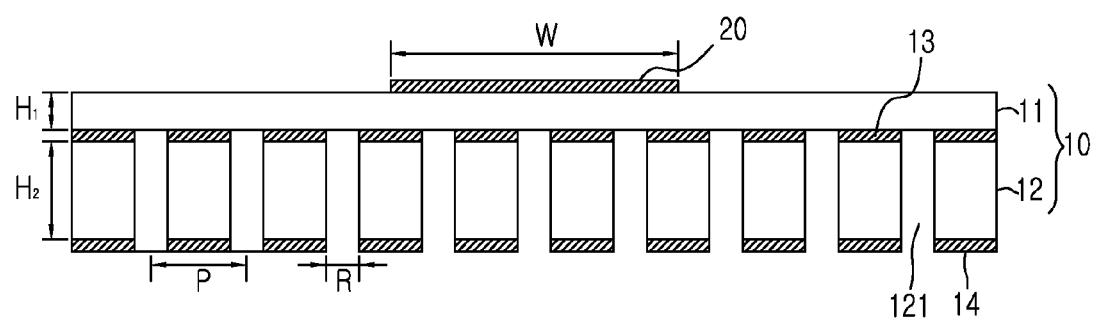
FIG. 1 is a cross-sectional view illustrating a portion of a magnetodielectric substrate according to an exemplary embodiment of the present invention.

FIG. 1 is a cross-sectional view illustrating a portion of a magnetodielectric substrate according to an exemplary embodiment of the present invention. The magnetodielectric substrate preferably has an Air Via Substrate (AVS) structure. That is, an air via 121 is formed to a predetermined depth in one side of a dielectric substrate 10. A plurality of air vias 121 have the same diameter and are formed with a predetermined equal interval to have one AVS structure in its entirety.

In more detail, a first dielectric layer 11 is stacked on a second dielectric layer 12 of the substrate 10. Preferably, the first dielectric layer 11 is applied as an upper side of the substrate, and the second dielectric layer 12 is applied as a lower side of the substrate. The second dielectric layer 12 serves as a layer in which the air vias 121 are formed. Conductive patterns 13 and 14 are formed on the upper and lower sides of a portion of the second dielectric layer 12 in the area excluding the air vias 121.

Here, "H1" and "H2" are the thickness of the respective dielectric layers, "R" is a diameter of the air via, "P" is an interval between the air vias, and "W" is a width of a transmission line 20 according to an exemplary embodiment of the present invention.

In other words, an effective permittivity and an effective permeability higher than those of the conventional dielectric substrate may be obtained by controlling the above parameters. In addition, a volume of an antenna radiator applied to an electronic apparatus (for example, a mobile terminal) may be reduced by controlling a refractive index of a dielectric substrate by changing some of these parameters.

Figure 2:
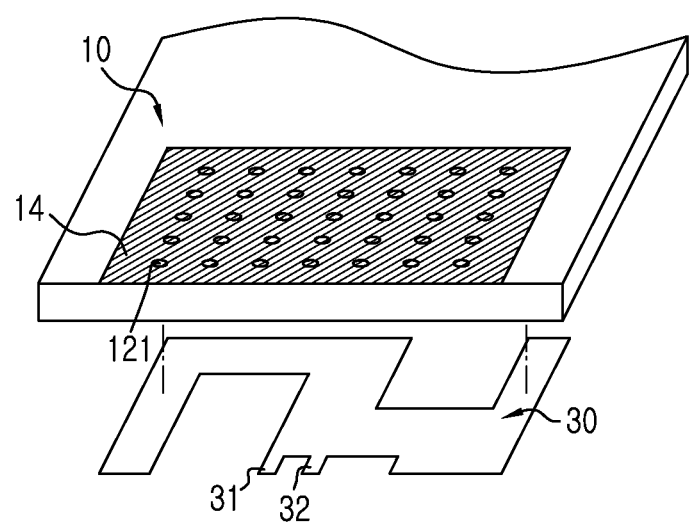
FIG. 2 is a perspective view illustrating a portion of the magnetodielectric substrate where an antenna radiator is applied to a magnetodielectric substrate according to an exemplary embodiment of the present invention.

FIG. 2 is a perspective view illustrating a portion where an antenna radiator 30 is applied to a magnetodielectric substrate 10 according to an exemplary embodiment of the present invention. The antenna radiator 30 is applied to the magnetodielectric substrate 10. At this point, the substrate 10 has a magnetodielectric structure on its one side, and the antenna radiator 30 is installed on the other side of the substrate 10 in a section where air vias are not formed.

The antenna radiator 30 is applicable to various methods. For example, when applied to the magnetodielectric substrate, the antenna radiator 30 may be directly attached on the substrate surface without a separate carrier. This attachment without a separate carrier may be possible by controlling the above parameters. Furthermore, preferably, the antenna radiator 30 may be installed on a position overlapping a portion of the substrate 10 that has the magnetodielectric structure. More preferably, a feeding portion 31 and a ground portion 32 of the antenna radiator 30 may overlap the portion of the substrate that has the magnetodielectric structure.

In addition, the magnetodielectric structure may preferably perform a function of a periodic structure having a predetermined period. This magnetodielectric structure operates as a periodic structure that prevents propagation of waves in a specific frequency band. That is, due to L,C parallel coupling, impedance increases, so that a surface wave of a relevant frequency is suppressed. Therefore, when this magnetodielectric structure is applied to the portion (the ground portion and the feeding portion) where the antenna radiator and the substrate are electrically connected, a condition of the electrical connection portion is changed, so that a Specific Absorption Ratio (SAR) may be reduced and a gain of an antenna apparatus may be improved.

Exemplary Embodiment

Figure 3:
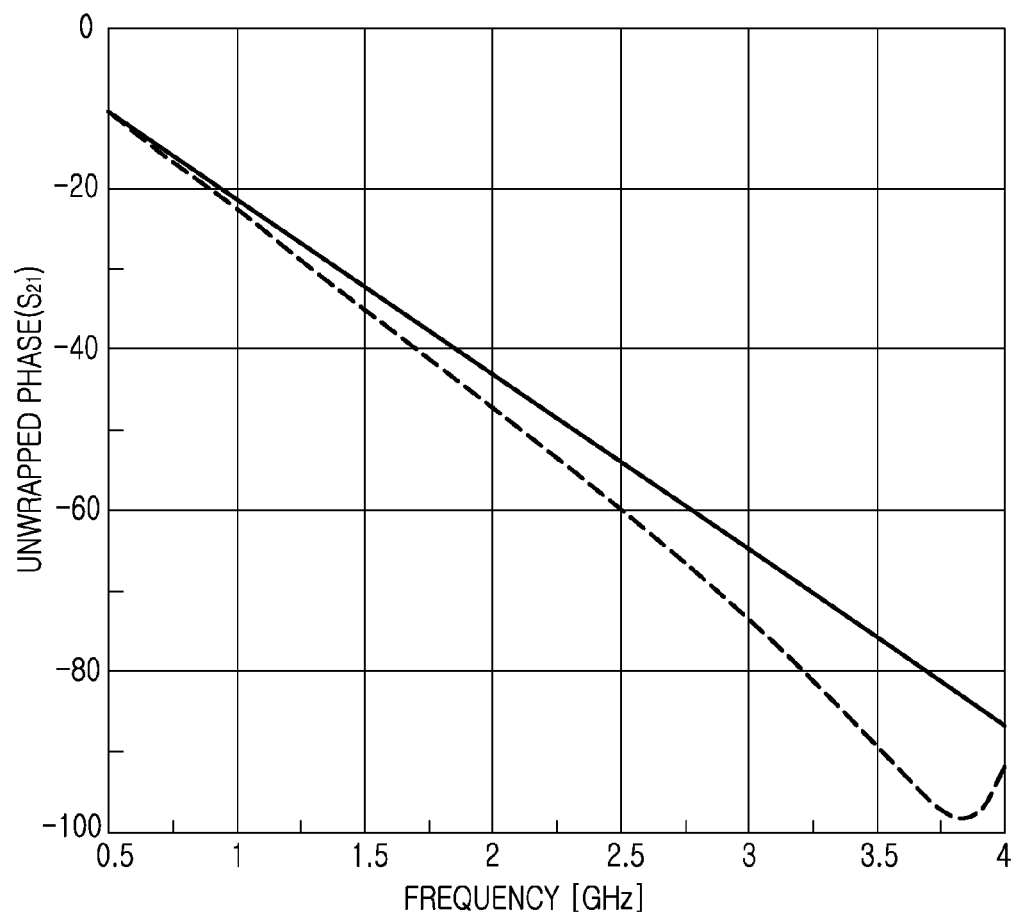
FIG. 3 is a graph comparing phases of $S_{21}$ of a transmission line applied to a general dielectric substrate (FR4) and an Air Via Substrate (AVS) according to an exemplary embodiment of the present invention.

FIG. 3 is a graph comparing phases of $S_{21}$ of transmission lines applied to a general dielectric substrate (FR4) and an Air Via Substrate (AVS) according to an exemplary embodiment of the present invention.

In order to examine a characteristic of the above-described magnetodielectric substrate structure (referred to as an AVS structure hereinafter) according to an exemplary embodiment of the present invention, a refractive index, a specific permittivity, and a specific permeability have been calculated through a simulation using a microstrip transmission line. An FR4 substrate ($\in$ r=4.2) has been used for the simulation to determine manufacturing and measurement results, and a thickness of each dielectric substrate is 0.787 mm.

First, a phase difference at the microstrip transmission line has been determined through the simulation in order to determine an influence by the AVS structure. The length of the designed line is 10 mm, a diameter "R" and an interval "P" of an air via are 0.4 mm and 0.8 mm, respectively.

As a result of the measurement, as illustrated in FIG. 3, it is revealed that a phase of the transmission line designed on the AVS structure is greater than that of the transmission line designed on the general FR4 substrate. Such a result denotes a refractive index may be controlled by the AVS structure according to an exemplary embodiment of the present invention.

Figure 4A:
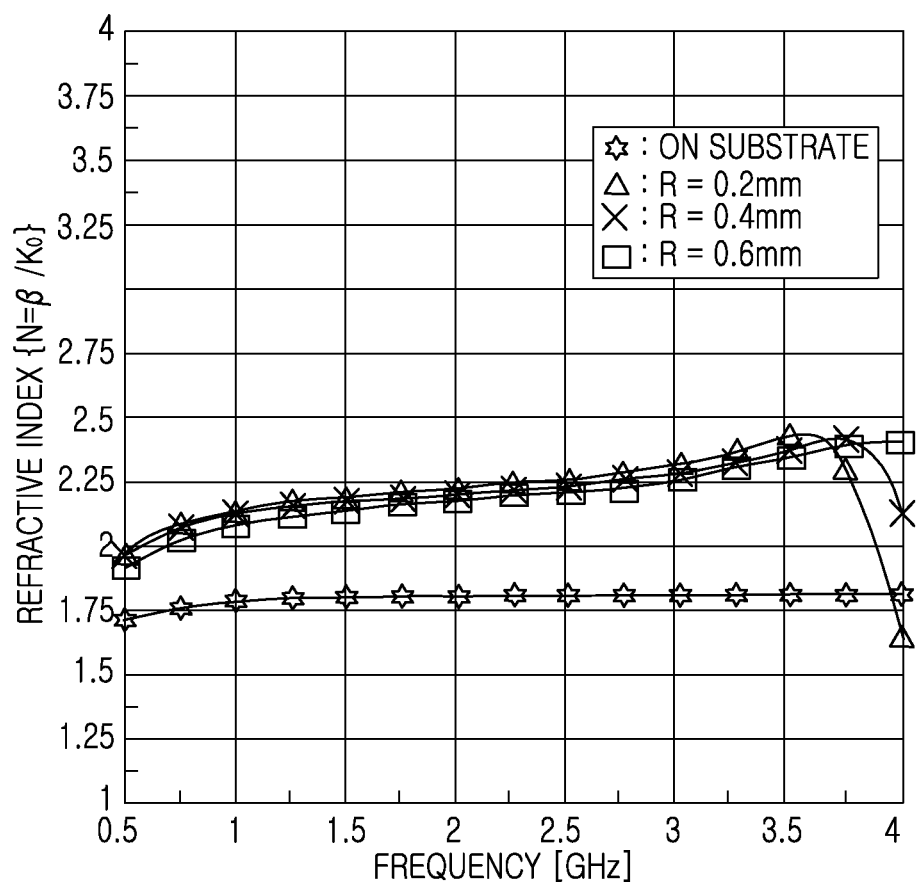
FIG. 4 is a graph comparing refractive indexes depending on a diameter, an interval of an air via, and a thickness of a dielectric in a general dielectric substrate (FR4) and an Air Via Substrate (AVS) according to an exemplary embodiment of the present invention.
Figure 4B:
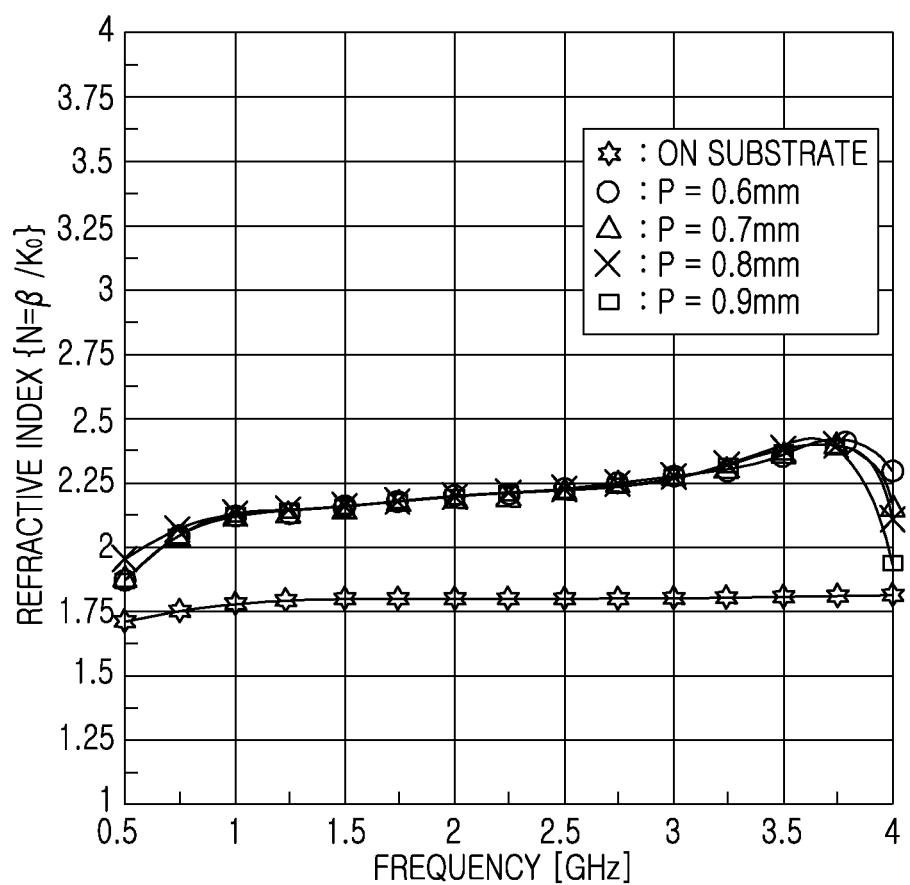
Figure 4C:
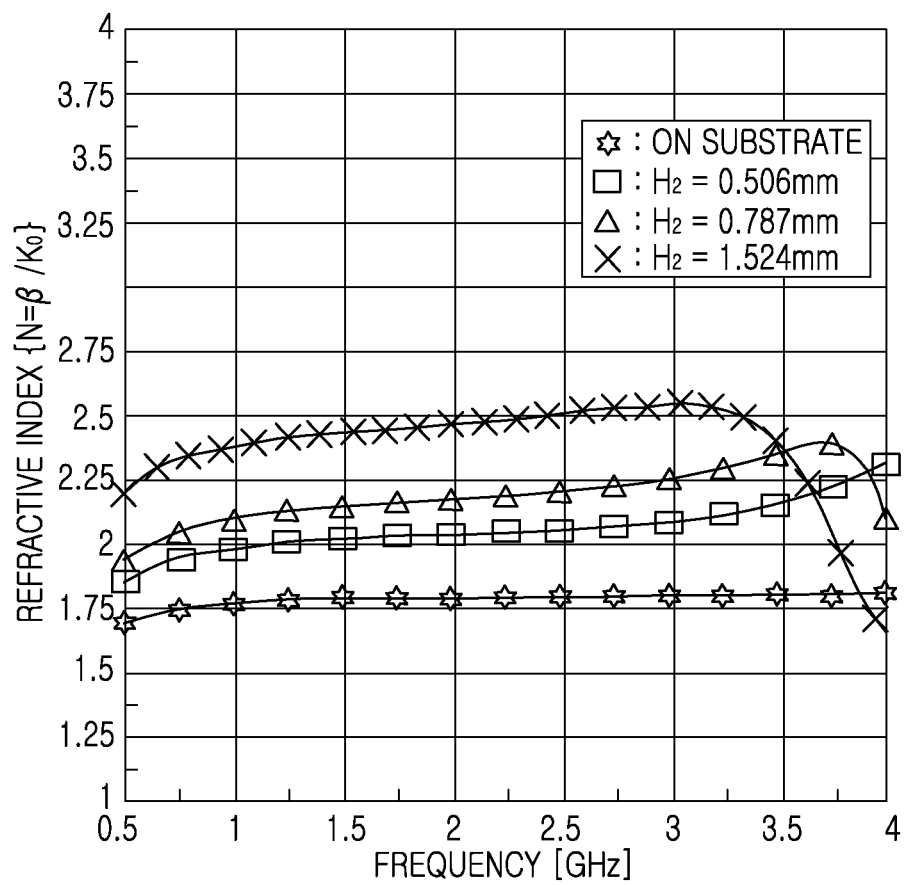

FIGS. 4A, 4B and 4C are graphs comparing refractive indexes depending on a diameter, an interval of an air via, and a thickness of a dielectric in a general dielectric substrate (FR4) and an Air Via Substrate (AVS) according to an exemplary embodiment of the present invention.

FIG. 4A illustrates a characteristic change depending on a diameter "R" of an air via in the AVS structure. As illustrated, refractive indexes are compared in the case where a diameter of an air via is changed to about 0.2 mm to 0.6 mm. At this point, under the condition that the thickness H1 and H2 of the dielectric substrate are the same (0.787 mm) as described above and the interval between the air vias is 0.8 mm, only the diameter of the air via has been changed.

As is revealed from the measurement results, the transmission line designed on the AVS structure has showed a greater refractive index than the transmission line designed on the FR4 substrate. In addition, the diameter of 0.2 mm has showed a greater refractive index than the diameter of 0.4 mm. Therefore, it is expected that the refractive index (or a specific permittivity and a specific permeability) of a dielectric substrate may be controlled by using even the diameter of the air via.

FIG. 4B illustrates a characteristic change depending on an interval P between the air vias in the AVS structure. At this point, under the condition that the thickness H1 and H2 of the dielectric substrate are the same (0.787 mm) as described above and the diameter of the air via is 0.4 mm, only the interval between the air vias has been changed to about 0.6 mm to 0.9 mm.

As is revealed from the measurement results, even when the interval P between the air vias changes, the refractive index does not change much. Therefore, it is revealed that a range in which the interval between the air vias can control the refractive index is very narrow. However, the refractive index is increased by applying the AVS structure.

FIG. 4C illustrates a characteristic change depending on an H2 change corresponding to the thickness of the second dielectric layer in the AVS structure. At this point, under the condition that the thickness H1 of the first dielectric layer is 0.787 mm and the diameter and the interval of the air via are 0.4 mm and 0.8 mm, respectively, H2 has been changed from 0.506 mm to 1.524 mm.

In addition, unlike the case where the diameter and the interval of the air via change, when the thickness of the dielectric changes, the width of the transmission line having a predetermined characteristic impedance (50Ω) changes much. During the simulation, the width (W) of the transmission line has been controlled such that the characteristic impedances are the same for each dielectric thickness, and when the dielectric thickness values are 0.506 mm, 0.787 mm, and 1.524 mm, the widths of the transmission lines are 2.518 mm, 2.985 mm, and 4.47 mm.

From results calculated through the simulation, when the thickness H2 gets thicker, the refractive index increases remarkably. From this result, it is revealed that a dielectric thickness in the AVS structure is a primary parameter determining the refractive index.

Therefore, when the AVS structure having the above-described characteristic is applied to design of an antenna, it is considered that a physical size of an antenna apparatus may be reduced similarly with the case of using a general magnetodielectric.

Figure 5:
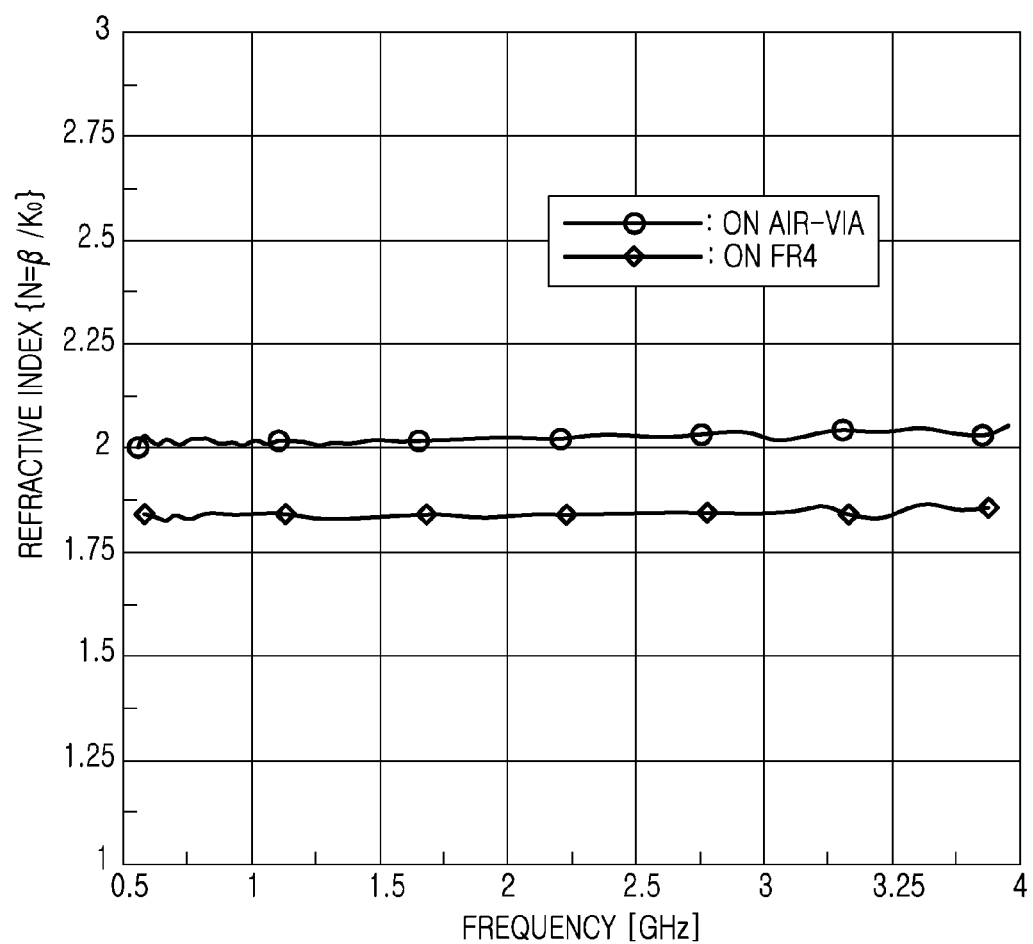
FIG. 5 is a graph comparing refractive indexes of a microstrip transmission line applied to a general dielectric substrate (FR4) and an Air Via Substrate (AVS) according to an exemplary embodiment of the present invention.

FIG. 5 is a graph comparing refractive indexes of a microstrip transmission line applied to a general dielectric substrate (FR4) and an Air Via Substrate (AVS) according to an exemplary embodiment of the present invention.

To verify simulation results, a microstrip transmission line having the AVS structure has been manufactured, and a refractive index, an effective permittivity, and an effective permeability have been calculated from measurement results. In the manufactured AVS structure, an FR4 substrate ($\in$ r=4.2) has a thickness of 0.787 mm, an air via has a diameter of 0.4 mm, an interval between air vias is 0.8 mm, and the transmission line has a length of 10 mm.

Examination of a refractive index calculated from measurement results of a phase $S_{21}$ of the transmission line shows that the general FR4 substrate has a refractive index of about 1.85. However, a refractive index of 2 or more which is greater than that of the general FR4 substrate is calculated in a transmission line designed on the AVS structure. As described above, from the measurement results of the manufactured transmission line, it is revealed that an electromagnetic wave constant or a refractive index increases.

Figure 6A:
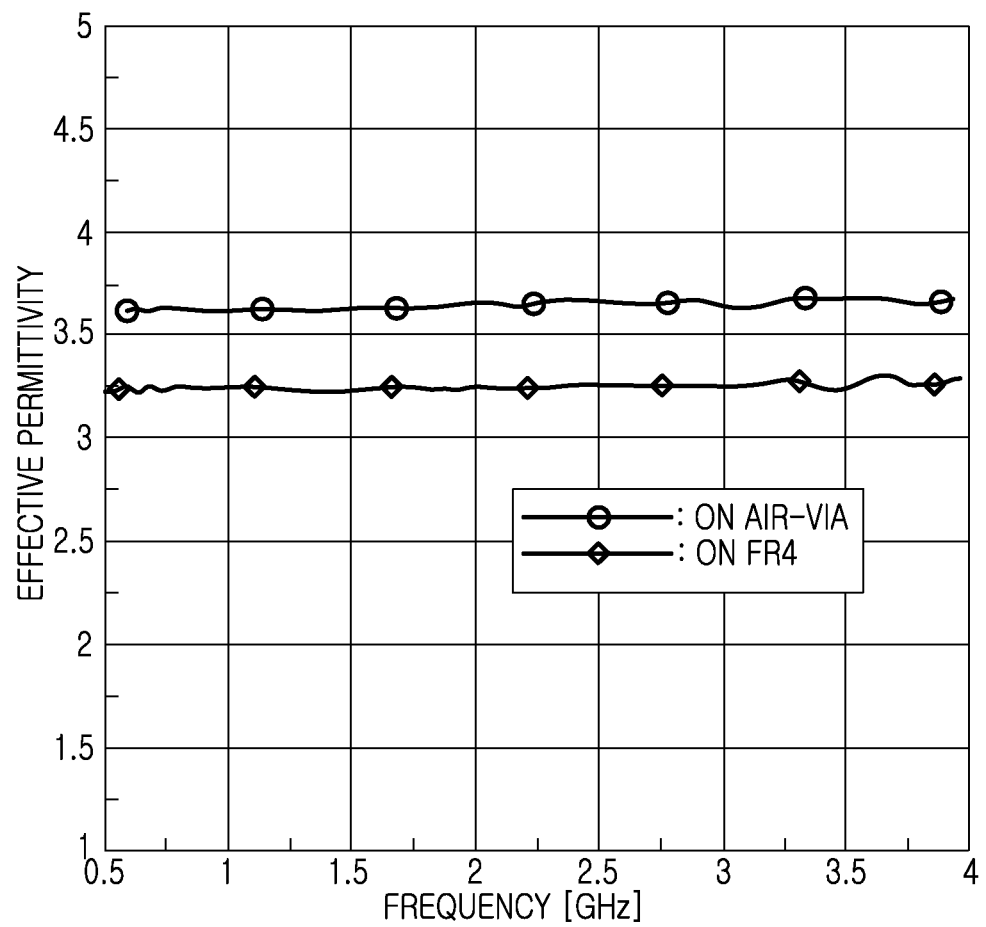
FIG. 6 is a graph comparing an effective permittivity with an effective permeability calculated from a refractive index computed from a result of FIG. 5 according to an exemplary embodiment of the present invention.
Figure 6B:
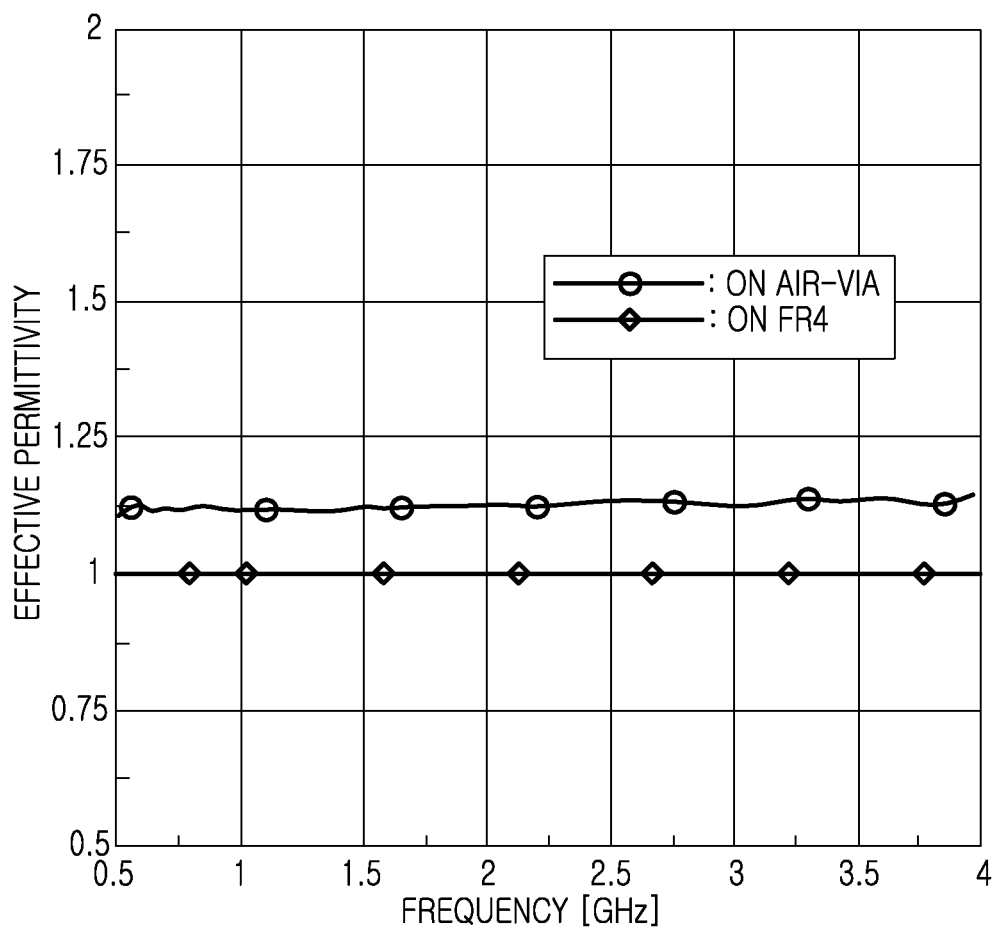

FIGS. 6A and 6B are a graph comparing an effective permittivity with an effective permeability calculated from a refractive index computed from a result of FIG. 5 according to an exemplary embodiment of the present invention.

As illustrated in FIG. 6A and FIG. 6B, an effective permittivity (a) of the AVS structure calculated from a refractive index has a value of 3.5 or more on a transmission line designed on the AVS structure, whereas a general FR4 substrate has an effective permittivity of 3.25. In addition, an effective permeability (b) of the AVS structure calculated from the refractive index has a value of 1 or more on the transmission line designed on the AVS structure, whereas the general FR4 substrate has an effective permeability of 1.

As described above, from measurement results of the transmission line manufactured on the AVS structure and the FR4 substrate, it is revealed that a refractive index and an effective permeability increase. This denotes that when an antenna is designed using the AVS structure, miniaturization is possible.

A magnetodielectric and an antenna apparatus according to an exemplary embodiment realize the conventional magnetodielectric function and are easily manufactured at low costs. Also, when the antenna apparatus is applied, a radiator of a smaller size is applied, so that miniaturization of an apparatus is achieved at a level not known heretofore.

Although the invention has been shown and described with reference to certain exemplary embodiments thereof, it will be understood by those skilled in the art that various changes in form and details may be made therein without departing from the spirit and scope of the invention as defined by the appended claims and their equivalents. Therefore, the scope of the present invention should not be limited to the above-described embodiments but should be determined by not only the appended claims but also the equivalents thereof.

What is claimed is:

1. A magnetodielectric substrate comprising:
   a first dielectric layer having a predetermined height;
   a second dielectric layer stacked on the first dielectric layer;
   conductive patterns coated on an upper surface and a lower surface of one of the first and second dielectric layers; and
   a plurality of air vias formed in the dielectric layer with a predetermined diameter and arranged at predetermined intervals such that the air vias extend to the conductive patterns of the upper and lower surfaces from the dielectric layer on which the conductive patterns are coated,
   wherein the conductive patterns are excluded from the predetermined intervals in which the air vias are arranged.

2. The magnetodielectric substrate of claim 1, wherein the air vias are formed in a shape of a cavity and have a circular cross-section.

3. The magnetodielectric substrate of claim 2, wherein all of the air vias have the same predetermined diameter, and the predetermined intervals between the air vias is the same.

4. The magnetodielectric substrate of claim 3, wherein an electrical characteristic of the substrate is controlled by changing at least one of a size of the diameter of the air via, the interval between the air vias, and a thickness of at least one of the first and second dielectric layers.

5. An antenna apparatus of a wireless apparatus, comprising:
   a substrate in which a portion or an entirety thereof is comprised of a magnetodielectric structure; and
   an antenna radiator mounted on the substrate for performing a radiation operation,
   wherein the magnetodielectric structure comprises:
   a first dielectric layer having a predetermined height;
   a second dielectric layer stacked on the first dielectric layer;
   conductive patterns coated on an upper surface and a lower surface of one of the first and second dielectric layers; and
   a plurality of air vias formed in the first dielectric layer with a predetermined diameter and arranged at predetermined intervals such that the air vias extend to the conductive patterns of the upper and lower surfaces from the dielectric layer on which the conductive patterns are coated.

6. The antenna apparatus of claim 5, wherein the air vias are formed in a shape of a cavity and have a circular cross-section.

7. The antenna apparatus of claim 6, wherein all of the air vias have the same diameter, and the predetermined intervals between the air vias is the same.

8. The antenna apparatus of claim 7, wherein an electrical characteristic of the substrate is controlled by changing at least one of a size of the predetermined diameter of the air vias, the interval between the air vias, and a thickness of at least one of the first and second dielectric layers.

9. The antenna apparatus of claim 8, wherein the antenna radiator is installed on the substrate in a position that overlaps the magnetodielectric structure of the substrate.

10. The antenna apparatus of claim 9, wherein the antenna radiator is installed on a surface of the dielectric layer without conductive patterns coated thereon.

11. The antenna apparatus of claim 5, wherein the substrate has a magnetodielectric structure portion on one side, and the antenna radiator is arranged on another side of the substrate in a section where the air vias are not formed.

12. The antenna apparatus of claim 9, wherein a feeding portion and a ground portion of the antenna radiator overlap the portion of the substrate having the magnetodielectric structure to reduce a Specific Absorption Ratio (SAR) of the antenna apparatus and increase the gain.

13. The antenna apparatus of claim 11, wherein a feeding portion and a ground portion of the antenna radiator overlap the portion of the substrate having the magnetodielectric structure to reduce a Specific Absorption Ratio (SAR) of the antenna apparatus.

14. A mobile terminal comprising the antenna apparatus according to claim 5.

15. The mobile terminal of claim 14, wherein a feeding portion and a ground portion of the antenna radiator overlap the portion of the substrate having the magnetodielectric structure to reduce a Specific Absorption Ratio (SAR) of the antenna apparatus.

* * * * *